(12) United States Patent
Kusumoto et al.

(10) Patent No.: US 6,348,369 B1
(45) Date of Patent: *Feb. 19, 2002

(54) METHOD FOR MANUFACTURING SEMICONDUCTOR DEVICES

(75) Inventors: Naoto Kusumoto; Toru Takayama; Masato Yonezawa, all of Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/390,513

(22) Filed: Sep. 3, 1999

Related U.S. Application Data

(63) Continuation of application No. 08/735,554, filed on Oct. 23, 1996, now Pat. No. 6,027,960.

(30) Foreign Application Priority Data

Oct. 25, 1995 (JP) ............................................. 7-302189
Nov. 1, 1995 (JP) ............................................. 7-308138

(51) Int. Cl.[7] ............................ H01L 21/00; B08B 3/12; B08B 6/00
(52) U.S. Cl. .......................... 438/166; 438/906; 117/8; 134/1
(58) Field of Search ................................ 438/708, 158, 438/159, 166, 905; 134/1

(56) References Cited

U.S. PATENT DOCUMENTS

| | | | |
|---|---|---|---|
| 4,292,093 A | | 9/1981 | Ownby et al. |
| 4,559,091 A | * | 12/1985 | Allen et al. ...................... 117/8 |
| 4,863,561 A | * | 9/1989 | Freeman et al. ................ 134/1 |
| 4,942,058 A | | 7/1990 | Sano |
| 5,024,968 A | | 6/1991 | Engelsberg |
| 5,326,406 A | * | 7/1994 | Kaneko et al. ................ 134/1 |
| 5,352,291 A | | 10/1994 | Zhang et al. |

(List continued on next page.)

FOREIGN PATENT DOCUMENTS

JP 58-015227 1/1983

OTHER PUBLICATIONS

Tam, A. et al., Laser–cleaning techniques for removal of surface particulates, J. Appl. Phys. 71 (7), Apr. 1992, pp. 3515–3523.*

Brotherton, et al., "Excimer–Laser–Annealed Poly–Si Thin–Film Transistors", IEEE Transactions On Electron Devices, vol. 40, No. 2, Feb. 1993, pp. 407–413.

Kubo, et al., "Characteristics of Polycrystalline–Si Thin Film Transistors Fabricated by Excimer Laser Annealing Method", IEEE Transactions On Electron Devices, vol. 41, No. 10, Oct. 1994, pp. 1876–1879.

Kohno, et al., "High Performance Poly–Si TFTs Fabricated Using Pulsed Laser Annealing and Remote Plasma CVD with Low Temperature Processing", IEEE Transactions On Electron Devices, vol. 42, No. 2, Feb. 1995, pp. 251–257.

*Primary Examiner*—Long Pham
*Assistant Examiner*—William David Coleman
(74) *Attorney, Agent, or Firm*—Fish & Richardson P.C.

(57) ABSTRACT

A laser-annealing method includes the steps of a first step of cleaning a non-monocrystal silicon film formed on a substrate, and a second step of laser-annealing the non-monocrystal silicon film in an atmosphere containing oxygen therein, wherein the first and second steps are conducted continuously without being exposed to the air. Also, a laser-annealing device includes a cleaning chamber, and a laser irradiation chamber, wherein a substrate to be processed is transported between the cleaning chamber and the laser irradiation chamber without being exposed to the air.

30 Claims, 6 Drawing Sheets

U.S. PATENT DOCUMENTS

| | | |
|---|---|---|
| 5,372,836 A | 12/1994 | Imahashi et al. |
| 5,382,316 A * | 1/1995 | Hills et al. .................. 156/643 |
| 5,405,804 A | 4/1995 | Yabe |
| 5,424,244 A | 6/1995 | Zhang et al. |
| 5,529,630 A | 6/1996 | Imahashi et al. |
| 5,593,497 A | 1/1997 | Matsuyama et al. |
| 5,612,250 A * | 3/1997 | Ohtani et al. ............... 438/487 |
| 5,622,595 A * | 4/1997 | Gupta et al. ................ 438/710 |
| 5,669,979 A * | 9/1997 | Elliott et al. .................... 134/1 |
| 5,795,795 A * | 8/1998 | Kousai et al. .............. 438/166 |
| 5,843,225 A | 12/1998 | Takayama et al. |
| 5,843,833 A | 12/1998 | Ohtani et al. |
| 5,861,337 A * | 1/1999 | Zhang et al. ................ 438/437 |
| 5,958,268 A * | 9/1999 | Engelsberg et al. .... 219/121.84 |
| 6,027,960 A * | 2/2000 | Kusumoto et al. .......... 438/166 |

* cited by examiner

METHOD FOR MANUFACTURING SEMICONDUCTOR DEVICES

This is a continuation of U.S. application Ser. No. 08/735,554, filed Oct. 23, 1996 U.S. Pat. No. 6,027,960.

BACKGROUND OF THE INVENTION

1. Field of the Invention

The present invention relates to a method of laser-annealing an amorphous silicon film or a crystalline silicon film formed on an insulating substrate made of glass or the like to crystallize the film or to improve the crystallinity.

2. Description of the Related Art

In recent years, a technique has been widely researched in which laser-annealing is conducted on an amorphous silicon film or a crystalline silicon film (a silicon film having crystallinity such as polycrystal or microcrystal, which is not mono-crystal) formed on an insulating substrate made of glass or the like, that is, a non-monocrystal silicon film, to crystallize those films or to improve the crystallinity.

The crystalline silicon film formed by laser-annealing, for its high mobility, has been widely employed for a monolithic type liquid-crystal electro-optic device, etc., in which a thin-film transistor (TFT) is formed using the crystalline silicon film, and TFTs for pixel driving and drive circuits are then fabricated, for example, on a single glass substrate.

Also, a method has been preferred to employ in which pulsed laser beams such as an excimer laser is processed by an optical system so as to be formed into beams having a square spot of several cm$^2$ in cross section or beams having a linear shape of several mm width×several tens cm, and laser-annealing is conducted by scanning the laser beam thus processed (while the radiation position of the laser beams is moved relatively with respect to a surface to be irradiated), because it is improved in productivity and excellent industrially.

In particular, the use of the linear laser beam makes the productivity high because laser beams can be irradiated on the overall surface to be irradiated by the scanning operation conducted only in a direction perpendicular to the linear direction, which is different from a case in which spot-like laser beams that require the right and left scanning operation as well as the forward and backward scanning operation are used.

There arise several problems in conducting laser-annealing on the non-monocrystal silicon film by scanning spot-like or linear laser beams emitted from a pulsed laser beam source thereon.

For example, in the case where laser-annealing is conducted in the air, there arises such a problem that impurities of carbon contained in the air and other materials are liable to be mixedly inserted into the film, to thereby deteriorate the various characteristics such as the quality, the crystallinity or the mobility of the crystalline silicon film which has been annealed.

Also, in the case where laser-annealing is conducted by scanning beams which are spot-shaped or linear on the surface to be irradiated in a vacuum atmosphere or inactive gas atmosphere such as nitrogen, the following problems are caused in comparison with annealing in the air.

1) The crystallinity is deteriorated. That is, a high crystallinity cannot be obtained without largely increasing the energy density of a laser beam in comparison with annealing in the air.
2) The uniformity in the film of the crystal is deteriorated. Locations where the crystallinity is high and locations where the crystallinity is low are distributed in the film. For example, in the case where linear laser beams are scanned in a direction perpendicular to the linear direction of the beam, locations where the crystallinity is high and locations where the crystallinity is low appear in the form of a stripe pattern on the film surface. Accordingly, in the case where a plurality of thin-film transistors are manufactured using the fabricated crystalline silicon film, a variety of characteristics such as a threshold value or mobility are different depending on a position of the thin-film transistor on a substrate.
3) The use efficiency of an energy is deteriorated. For the purpose of enhancing the crystallinity, the energy density of laser must be increased. As the energy density is increased, the power consumption is also increased. In addition, the entire laser irradiating device including a laser oscillator and a circuit, a gas and an optical systems is largely consumed, resulting in the increased costs of a manufactured device. Also, although the crystallinity is increased as the energy density of laser is increased, an entire film which has been subjected to laser-annealing is remarkably roughened, thereby making it hard to manufacture the device by processing the film.

SUMMARY OF THE INVENTION

The present invention has been made to solve the above problems of the conventional device, and therefore an object of the present invention is to provide a laser-annealing method which is capable of remarkably improving crystallinity and uniformity, as well as the use efficiency of energy.

In order to solve the above problems, according to one aspect of the present invention, there is provided a laser-annealing method which comprises the steps of: a first step of cleaning a non-monocrystal silicon film formed on a substrate; and a second step of laser-annealing said non-monocrystal silicon film in an atmosphere containing oxygen therein; wherein said first and second steps are conducted continuously without being exposed to the air.

In the above method, it is preferable that said second step is conducted after an upper surface of said non-monocrystal silicon film has been oxidized in the atmosphere containing oxygen therein.

According to another aspect of the present invention, there is provided a laser-annealing method which comprises the steps of: a first step of cleaning a non-monocrystal silicon film formed on a substrate; a second step of oxidizing an upper surface of said non-monocrystal silicon film to form a silicon oxide film; and a third step of laser-annealing said non-monocrystal silicon film; wherein at least said first and second steps of the respective steps are conducted continuously without being exposed to the air.

In the above method, it is preferable that said third step is conducted in a nitrogen atmosphere.

According to still another aspect of the present invention, there is provided a laser-annealing device which comprises at least a cleaning chamber and a laser irradiation chamber, in which a substrate to be processed is transported between said cleaning chamber and said laser irradiation chamber without being exposed to the air.

According to yet still another aspect of the present invention, there is provided a laser-annealing device which comprises at least a cleaning chamber, a preliminary heating chamber and a laser irradiation chamber, in which a substrate to be processed is transported between said cleaning chamber and said preliminary heating chamber without being exposed to the air.

In this specification, the above term "continuously" means that no step in which impurities or other undesired materials are stuck on the non-monocrystal silicon film exists between said first and second steps.

Accordingly, for example, to provide a substrate transporting step, an alignment step, an annealing step, a step of heating the substrate up to a temperature necessary for the second step, a step of dehydrogenation step by heating, and so on fall within the "continuation" in this specification.

On the other hand, in the case where a step of exposing a non-monocrystal silicon film to a specific atmosphere that changes the quality of the film, a ion doping step, a film forming step, an etching step, a plasma processing step, a film coating step, and so on are conducted between the above first and second steps, these steps do not fall the definition of the "continuation" in this specification.

According to the present invention, in laser-annealing the non-monocrystal silicon film to crystallize the film or improve the crystallinity, the upper surface of the non-monocrystal silicon film is oxidized in an atmosphere containing oxygen therein, to particularly form a silicon oxide film 100 Å or less in thickness, and thereafter a laser beam is irradiated onto the silicon oxide film.

Also, according to the present invention, a laser beam is irradiated onto the non-monocrystal silicon film in a state where it is disposed in an atmosphere containing oxygen therein.

Further, according to the present invention, a step of cleaning the non-monocrystal silicon film to remove a natural oxide film or impurities, and a step of irradiating a laser beam onto the non-monocrystal silicon film in an atmosphere containing oxygen therein or a step of forming a silicon oxide film on the upper surface of the non-monocrystal silicon film in an atmosphere containing oxygen therein are continuously conducted without being exposed to the air.

When the upper surface of the non-monocrystal silicon film is oxidized to form the silicon oxide film 100 Å or less in thickness, and the silicon oxide film is laser-annealed in this state, not only the crystalline silicon film purer than that formed by laser-annealing in the air is obtained, but also the following excellent characteristics are obtained in comparison with a case of conducting laser annealing in the air or in another atmosphere.

1) The crystallinity of the crystalline silicon film is improved.
2) The crystallinity of the crystalline silicon film is uniformed in the film surface.
3) The energy density of laser necessary for crystallization is lowered.

With the formation of the very-thin oxide silicon film, it is presumed that the reflection/discharge of energy of a laser beam irradiated onto the non-monocrystal silicon film is suppressed so that a given energy is kept within the film. Therefore, a large amount of energy can be given to the non-monocrystal silicon film more than a case where no silicon oxide film is provided, to thereby improve the crystallinity.

Simultaneously, because the nonuniformity and dispersion of the energy density for each pulse of a laser beam are prevented, the crystallinity is also uniformed in quality within the film surface.

Further, because the reflection/discharge of a laser energy to an atmosphere is reduced so that the energy is effectively used for crystallization, the energy density of an irradiated laser beam can be lowered.

When a laser beam is irradiated to a non-monocrystal silicon film in a state where silicon oxide film is formed on the non-monocrystal silicon film at a high energy density as in the state where no silicon oxide film is provided, an excessive energy is given though an energy loss is reduced, with the result that the entire film is remarkably roughened although the crystallinity is enhanced. It is very hard to manufacture a device such as a thin-film transistor using such a film.

Also, it is preferable that the upper surface of the non-monocrystal silicon film is cleaned by HF aqueous solution or aqueous solution containing HF and $H_2O_2$ therein to remove the natural oxide film before conducting laser-annealing. It is preferable that the subsequent step of manufacturing the silicon oxide film, or step of laser-annealing in an atmosphere containing oxygen therein is conducted while heating the substrate because the rate of forming the silicon oxide film is improved. The above steps may be conducted while irradiating ultraviolet rays on the film.

In particular, it is preferable that the above cleaning step and the subsequent laser annealing step conducted in an oxygen atmosphere are continuously conducted without being exposed to the air, or the cleaning step, a heating (silicon oxide film forming) step which is conducted in an oxygen atmosphere, and the laser-annealing step are continuously conducted without being exposed to the air.

With the above method, the silicon oxide film is formed from the very clean upper surface of the non-monocrystal silicon film. As a result, the silicon oxide film formed becomes more uniform in thickness and quality, to thereby improve the uniformity of the quality of the film crystallized by laser-annealing within the substrate surface.

Further, the invasion by impurities into the non-monocrystal silicon film during laser-annealing is more reduced. As a result, a variety of characteristics such as the mobility or the threshold value of the device such as a thin-film transistor which is manufactured using the above film can be more stabilized within the substrate surface as well as between lots.

The atmosphere containing oxygen is preferably comprised of only oxygen, or the mixture gas of oxygen and an inactive gas such as nitrogen, helium or argon. The mixture gas preferably contains oxygen of 1% or more, more preferably 5% or more under the atmospheric pressure. When the oxygen content is 1% or less, a period of time necessary for forming a sufficient silicon oxide film becomes extremely long, or the silicon oxide film cannot be formed, thus obtaining the insufficient effect of the present invention. Therefore, it is not for practical use. If the oxygen content is 5% or more, the effect of the present invention is stably obtained.

In the case where air is used as an atmosphere containing oxygen in forming the silicon oxide film, the impurities such as carbon in the air is mixed into the film to be annealed, often resulting in cases in which the mobility of the crystalline silicon film and other various characteristics are lowered, or the characteristics for each lot are unstabilized. It should be noted that it is effective that, after the silicon oxide film is manufactured in another atmosphere, the film is laser-annealed in the air atmosphere.

Also, it is particularly preferable that oxygen or inactive gas which constitutes an atmosphere containing oxygen is 99.9% (3N) or higher but 99.99999% (7N) or lower in purity. With an atmosphere using the gas of this purity, carbon, water, hydrocarbon and other impurities are prevented from being mixed into the crystalline silicon film, to thereby obtain the crystalline silicon film which is stabilized in quality and characteristics and is excellent in characteristic. When the purity of oxygen or inactive gas which forms an atmosphere is less than 3N, there is little difference from a case of using the air atmosphere, and the film characteristic is liable to be unstabilized by the impurities. Also, even though the gas having a high purity more than 7N is used, there is no large difference from a case where the purity is 7N or less, but the costs are increased. Therefore, it is not preferable.

Moreover, when the thickness of the above silicon oxide film is set to 100 Å or more, the amount of mixture of the silicon oxide film into the crystalline silicon film is increased by the irradiation of a laser beam, to thereby lower a variety of characteristics such as the crystallinity or the mobility of the crystalline silicon film. On the other hand, when the thickness of the silicon oxide film is too narrowed to about 5 Å or less, the above-mentioned effects of the present invention is remarkably deteriorated. The thickness of the silicon oxide film is suitably set to 5 to 100 Å, preferably 10 to 50 Å, and more preferably 20 to 40 Å.

The pressure applied when conducting laser-annealing may be atmospheric pressure. In the case where the pressure applied when conducting laser-annealing is reduced to atmospheric pressure or less, in particular, to 0.01 to 700 Torr, the upper surface or the entirety of the crystalline silicon film is less roughened by the irradiation of pulsed laser beams by plural times, which is preferable. In other words, the pulsed laser beam irradiation resistance of the crystalline silicon film is improved so that a film less roughened is obtained. In the case where the pressure applied when conducting laser-annealing is more than 700 Torr, the roughness of the film is nearly identical with that in the case of atmospheric pressure. In the case where the pressure is less than 0.01 Torr, such effects as improvements in crystallinity, uniformity in quality, and the energy efficiency are then remarkably deteriorated.

It is preferable that the irradiation of a laser beam is conducted by scanning a laser beam which is slot-shaped or linear in cross section on a surface to be irradiated.

Also, it is preferable that the laser beam is irradiated from a pulsed laser source.

To implement the present invention, the non-monocrystal silicon film is exposed to an atmosphere containing oxygen therein, or the upper surface of the non-monocrystal silicon film is oxidized by heating or the irradiation of ultraviolet rays under the condition where the non-monocrystal silicon film is exposed to an atmosphere containing oxygen therein, and then the film thus obtained is laser-annealed.

After the upper surface of the non-monocrystal silicon film has been oxidized in the atmosphere containing oxygen in one chamber, the film may be laser-annealed in the atmosphere containing oxygen or in another atmosphere in another chamber.

Also, in the case where laser-annealing is conducted in an atmosphere containing oxygen therein within an atmosphere-controllable vessel, oxidation and laser-annealing can be conducted within one vessel, thus reducing the manufacture processes. In this case, it is preferable that a substrate is heated when conducting laser-annealing.

The silicon oxide film according to the present invention is completely different from a cap layer (what prevents the roughness (ridges) on the surface of the silicon film which is caused during laser-annealing by the mechanical strength of a film which is formed as a silicon oxide film or a silicon nitride film several 1000 Å in thickness on the amorphous silicon film when conducting laser-annealing mainly using a small-output continuous oscillation laser).

The above thick silicon oxide film, when using a large-output pulse laser such as an excimer layer as in the present invention, allows a large amount of silicon oxide to be mixed into a silicon film when conducting laser-annealing as described above, resulting in the deterioration of the quality and the characteristics of the crystalline silicon film formed.

When laser-annealing is conducted in the state where the cap layer is provided, the film is crystallized in the state where it is pressed against the cap layer. As a result, the growth of crystal is suppressed to deteriorate the crystallinity of the crystalline silicon film formed. In addition, a large stress remains inside the crystalline silicon film.

In the present invention, because the silicon oxide film is extremely thin, the growth of crystal is hardly suppressed, with the results that a higher crystallinity is obtained than that of the cap layer, and an internal stress can be also considerably reduced.

Hence, a thickness of the film that produces a mechanical strength to the extent that the ridges can be suppressed is improper for the silicon oxide film according to the present invention. Because the silicon oxide film according to the present invention is extremely thin to 100 Å or less, most of the silicon oxide film is scattered by the plural times of irradiation of pulsed laser beams so as to be removed.

The above and other objects and features of the present invention will be more apparent from the following description taken in conjunction with the accompanying drawings.

DETAILED DESCRIPTION OF THE PREFERRED EMBODIMENTS

Now, a description will be given in more detail of embodiments of the present invention with reference to the accompanying drawings.
(First Embodiment)

A first embodiment shows an example in which laser-annealing is conducted on a non-monocrystal silicon film in an atmosphere containing oxygen therein.

FIG. 2 shows a manufacturing process in accordance with this embodiment. First, a silicon oxide film 202 which is 2000 Å in thickness is formed as an under layer on a substrate 201 which is made of Corning 1737 having 127 $mm^2$ in area, and a non-monocrystal silicon film which is 500 Å in thickness is formed on the silicon oxide film 202, which process is continuously conducted through the plasma CVD technique.

Subsequently, a nickel acetate aqueous solution of 10 ppm is coated on the amorphous silicon film through the spin coating technique to form a nickel acetate layer. A surface active agent is preferably added to the nickel acetate aqueous solution. Although the nickel acetate layer is not limited to a film shape since it is extremely thin, it does not cause any problems in the subsequent processes.

Figure 2A:
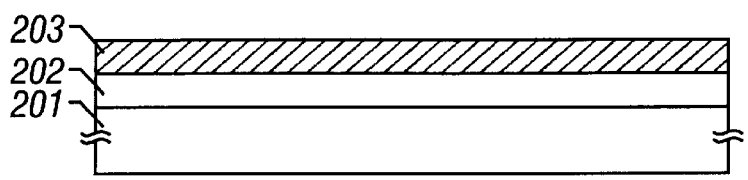
FIGS. 2A to 2F are diagrams showing a manufacturing process in accordance with the embodiment of the present invention.

Then, thermal annealing is conducted on the substrate 201 on which the respective films are laminated in the above manner, at 600° C. for four hours so that the amorphous silicon film is crystallized, to thereby form a crystalline silicon film 203 (FIG. 2A).

In this situation, nickel which is a catalytic element serves as a nucleus for crystal growth to facilitate crystallization. The action of nickel enables crystallization of the amorphous silicon film at a low temperature for a short period of time, that is, at 600° C. for four hours. The details are disclosed in Japanese Patent Unexamined Publication No. Hei 6-244104.

The density of the catalytic element is preferably set to $1 \times 10^{15}$ to $10^{19}$ atoms/cm$^3$. In the case of a high density such as $1 \times 10^{19}$ atoms/cm$^3$ or more, the crystalline silicon film exhibits the metallic property so that the semiconductor characteristics disappear. In this embodiment, the density of the catalytic element in the crystalline silicon film is set to $1 \times 10^{17}$ to $5 \times 10^{18}$ atoms/cm$^3$ at the minimum in the film. Those values are values which have been analyzed and measured through the secondary ion mass spectrometer (SIMS).

In order to further enhance the crystallinity of the crystalline silicon film 203 thus obtained, laser-annealing is conducted using an excimer laser.

Figure 1:
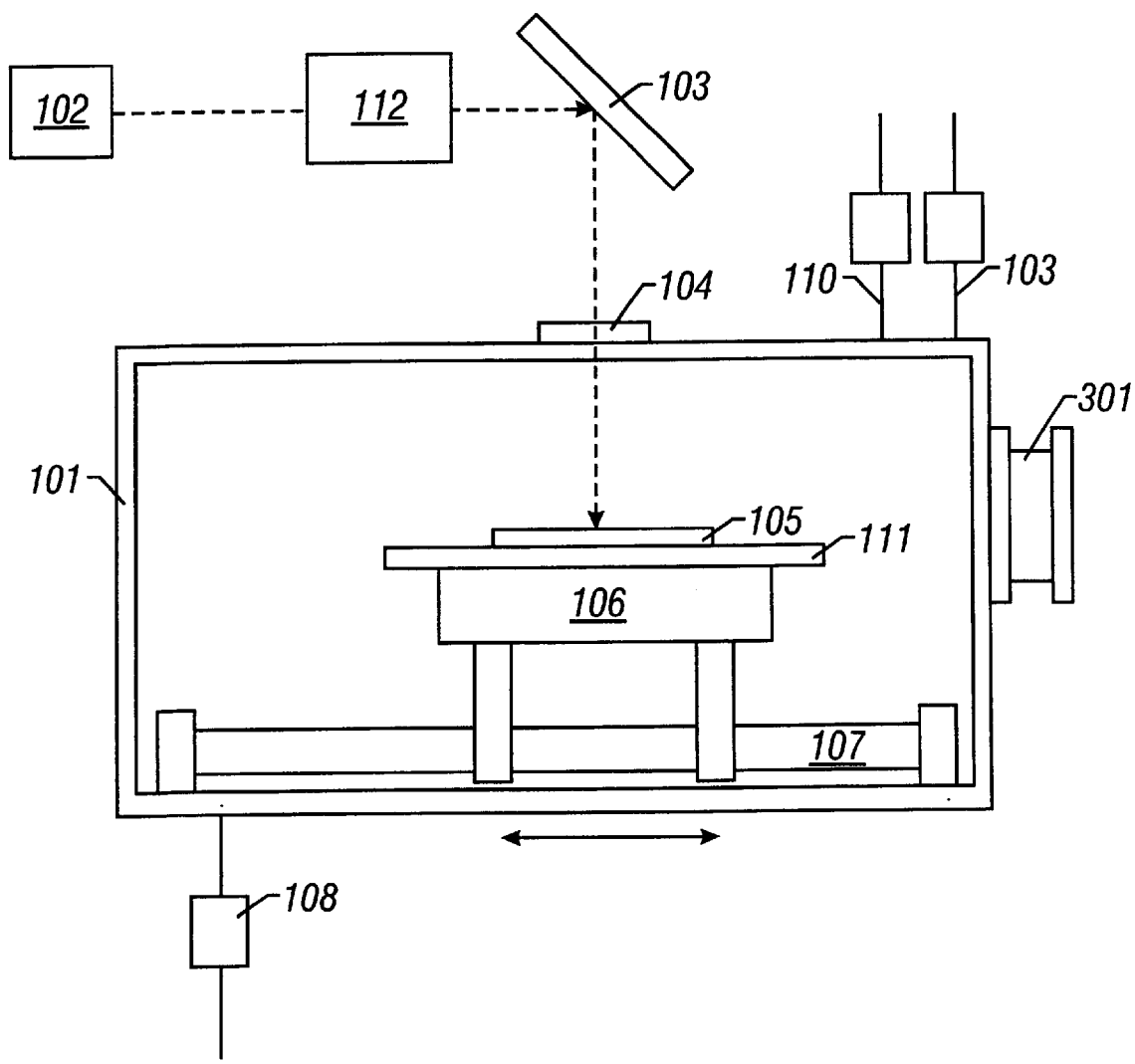
FIG. 1 is a diagram showing a laser irradiation chamber in accordance with an embodiment of the present invention.

A laser irradiation chamber in accordance with this embodiment is shown in FIG. 1 that shows a side cross-sectional view of the laser irradiation chamber.

Figure 3:
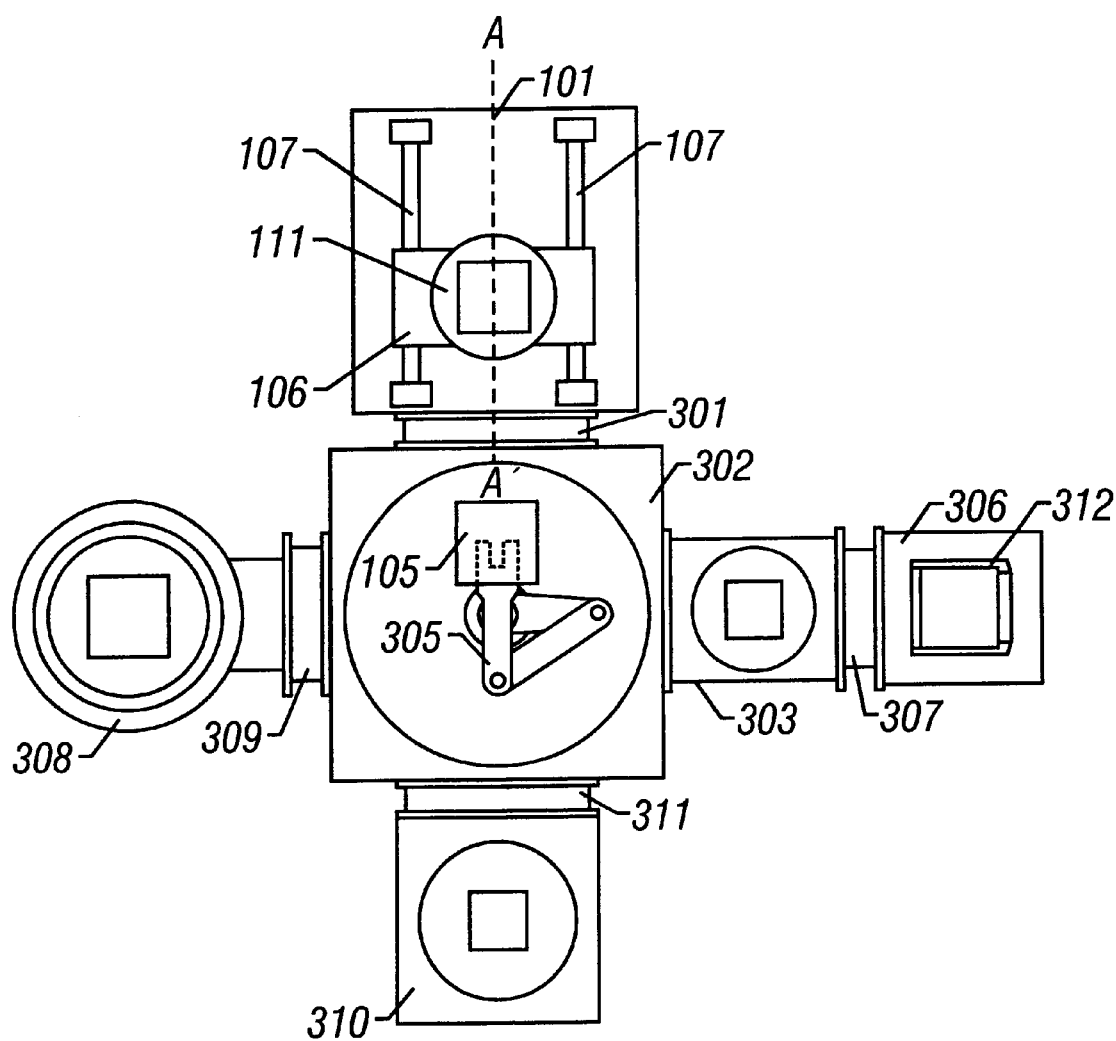
FIG. 3 is an upper view showing a laser annealing unit in accordance with the embodiment of the present invention.

FIG. 3 shows an upper view of a laser annealing unit in accordance with this embodiment. In this example, a multi-chamber type laser annealing unit shown in FIG. 3 is employed. A cross-sectional view taken along a line A–A' in FIG. 3 corresponds to FIG. 1.

In FIG. 1, a laser irradiation chamber 101 functions so that a pulsed laser beam, which is irradiated from a laser oscillation unit 102 and then processed into a linear shape in cross section by an optical system 112, is reflected by a mirror 103, and then irradiated on a substrate 105 to be processed through a window 104 which is made of quartz.

The laser oscillation unit 102 as used in this embodiment is the one that oscillates XeCl excimer laser beams (wavelength of 308 nm). Instead, a KrF excimer laser (wavelength of 248 nm) may be used.

The substrate 105 to be processed is located on a stage 111 disposed on a table 106 and is kept at a predetermined temperature (100 to 700° C.) by a heater disposed within the table 106.

The table 106 is moved in a direction perpendicular to a linear direction of a linear laser beam in such a manner that the laser beam can be irradiated on the upper surface of the substrate 105 to be processed in the scanning manner.

The laser irradiation chamber 101 which can control atmosphere includes therein a vacuum gas-exhaust pump 108 as pressure-reduction and gas-exhaust means. Also, the laser irradiation chamber 101 also includes, as gas supply means, a gas supply pipe 109 connected to a hydrogen bomb through a valve and a gas supply pipe 110 connected to a nitrogen or another-gas bomb through a valve.

The laser irradiation chamber 101 is coupled to a substrate transfer chamber 302 through a gate valve 301.

In FIG. 3, the laser irradiation chamber 101 shown in FIG. 1 is coupled to the substrate transfer chamber 302 through the gate valve 301.

The unit shown in FIG. 3 will be described. Within a load/unload chamber 306 is disposed a cassette 312 that receives therein a large number of substrates 105 to be processed, for example, 20 substrates 105. A single substrate 105 is moved from the cassette 312 to an alignment chamber 303 by a robot arm 305.

In the alignment chamber 303 is disposed an alignment mechanism for correcting the positional relation between the substrate 105 to be processed and the robot arm 305. The alignment chamber 303 is connected to the load/unload chamber 306 through a gate valve 307.

A preliminary heating chamber 308 is so designed as to preliminarily heat a substrate 105 to be laser-annealed up to a predetermined temperature to reduce a period of time necessary for heating the substrate 105 in the laser irradiation chamber 101, resulting in an improvement of throughput.

The preliminary heating chamber 308 has its interior formed of cylindrical quartz. The cylindrical quartz is surrounded by a heater. The preliminary heating chamber 308 also includes a substrate holder which is made of quartz. The substrate holder is provided with a susceptor that can receive a large number of substrates 105 therein. The substrate holder moves up and down by an elevator. The substrate 105 is heated by the heater. The preliminary heating chamber 308 is coupled to the substrate transfer chamber 302 by the gate valve 309.

The substrate 105 which has been preheated for a predetermined period of time in the preliminary heating chamber 308 is brought back to the substrate transfer chamber 302 by the robot arm 305. Then, after the substrate 105 is aligned again in the alignment chamber 303, it is moved to the laser irradiation chamber 101 by the robot arm 305.

After the completion of irradiation of the laser beam, the substrate 105 to be processed is taken out to the substrate transfer chamber 302 by the robot arm 305 before being moved to an annealing chamber 310.

The cooling chamber 310 is connected to the substrate transfer chamber 302 through a gate valve 311, and the substrate 105 to be processed which is disposed on the stage made of quartz is exposed to infrared rays emitted from a lamp and a reflection plate in such a manner that it is gradually cooled.

The substrate 105 to be processed which has been cooled in the cooling chamber 310 is moved to the load/unload chamber 306 by the robot arm 305 and then received in the cassette 312.

In the above manner, the laser-annealing process is completed. The above-mentioned process is repeated, thereby being capable of continuously processing a large number of substrates 105 one by one.

A process of conducting laser-annealing will be described using the unit shown in FIGS. 1 and 3. First, the substrate 105 to be processed (a substrate 201 having a crystalline silicon film 203), after having been cleaned by an HF aqueous solution or a mixture aqueous solution of HF and $H_2O_2$ until a natural oxide film has been removed from the substrate 105, is received in the cassette 312, and the cassette 312 is then disposed in the load/unload chamber 306.

In FIG. 3, the substrate 105 to be processed which is transferred from the load/unload chamber 306 in this embodiment is transferred directly to the laser irradiation chamber 101 without being transferred to the preliminary heating chamber 308 after it has been subjected to alignment, in order that the substrate 105 is prevented from being oxidized by air in the preliminary heating chamber. It should be noted that it is effective that the substrate 105 is heated in the preliminary heating chamber 308 to such an extent that the upper surface of the crystalline silicon film 203 is not oxidized.

Oxygen is supplied from the gas supply pipe 109, and nitrogen is supplied from the gas supply pipe 110, respectively, to the laser irradiation chamber 101, to provide an atmosphere of oxygen 20% and nitrogen 80% therein, after vacuum has been produced in the laser irradiation chamber 101 by the vacuum air-exhaust pump 108. In this example, both of oxygen and nitrogen supplied into the laser irradiation chamber are 99.99999% (7N) in purity. In this situation, pressure is set to the atmospheric pressure.

The substrate 105 to be processed which has been transferred to the laser irradiation chamber 101 is heated for about 5 minutes in the state where the substrate 105 is located on the stage 111 so that the temperature of the substrate 105 reaches a temperature suitable for laser-annealing, in this example, 200° C. The upper surface of the crystalline silicon film 203 is oxidized by oxygen contained in an atmosphere during heating, to thereby form a pure silicon oxide film 204 without being mixed with impurities such as carbon in the air. The thickness of the crystalline silicon oxide film 204 is set to 10 to 50 Å, in this example, 30 Å.

Also, in FIG. 1, the linear laser beam irradiated onto the substrate 105 to be processed is 0.34 mm width×135 mm length. The energy density of a laser beam on a surface to be irradiated is set to a range of 100 to 500 mJ/cm$^2$, for example, 260 mJ/cm$^2$. The linear laser beam is scanned by moving the table 106 in one direction at 2.5 mm/s. The oscillation frequency of the laser beam is set to 200 Hz, and when an attention is paid to one point of an object to be irradiated, laser beams of 10 to 50 shots are irradiated thereon.

Figure 2B:
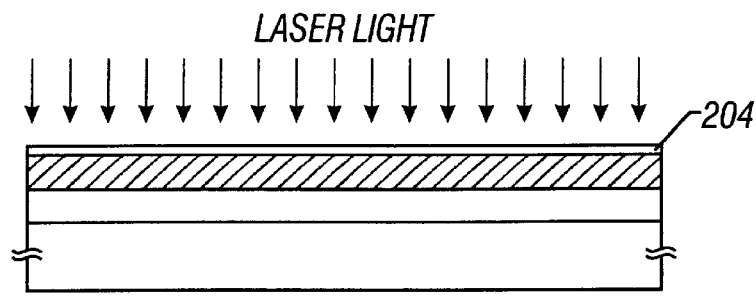

In this way, laser-annealing is conducted on the crystalline silicon film 203, to thereby improve the crystallinity (FIG. 2B).

Most of the silicon oxide film 204 is scattered by the plural times of irradiation of pulsed laser beams because it is extremely thin.

Thereafter, the substrate 105 to be processed is transferred to the cooling chamber 310, and after cooling, the substrate 105 is received in the cassette 312 of the load/unload chamber 306.

Since the cooling process is conducted in the air atmosphere, the upper surface of the crystalline silicon film 203 is liable to be oxidized during the cooling process. Also, in laser-annealing in an atmosphere containing oxygen therein, even though the silicon oxide film 204 is scattered by the plural times of irradiation of laser beams, there is a case in which the upper surface of the silicon film which has been crystallized is newly oxidized by oxygen contained in the atmosphere. Further, there is a case in which all of the silicon oxide film 204 is not scattered even though it is subjected to laser irradiation. As described above, because the silicon oxide film is liable to remain on the upper surface of the crystalline silicon film 203 after the completion of the laser annealing process, it is preferable that the upper surface of the crystalline silicon film 203 is reduced by the HF aqueous solution or the mixture solution of HF and $H_2O_2$ before shifting to the subsequent process, to thereby remove the silicon oxide film.

Now, a comparison will be made between the crystalline silicon film formed by the above process and the crystalline silicon film formed in another atmosphere. As in the above-mentioned method, an atmosphere applied for laser-annealing and the energy density of a laser beam are changed to manufacture a crystalline silicon film. The atmosphere as applied is $N_2/H_2$ (3%) and $N_2$ 100%. All of the respective gases are set to 99.99999% (7N) or higher in purity, and the atmosphere is set to the atmospheric pressure.

Figure 4:
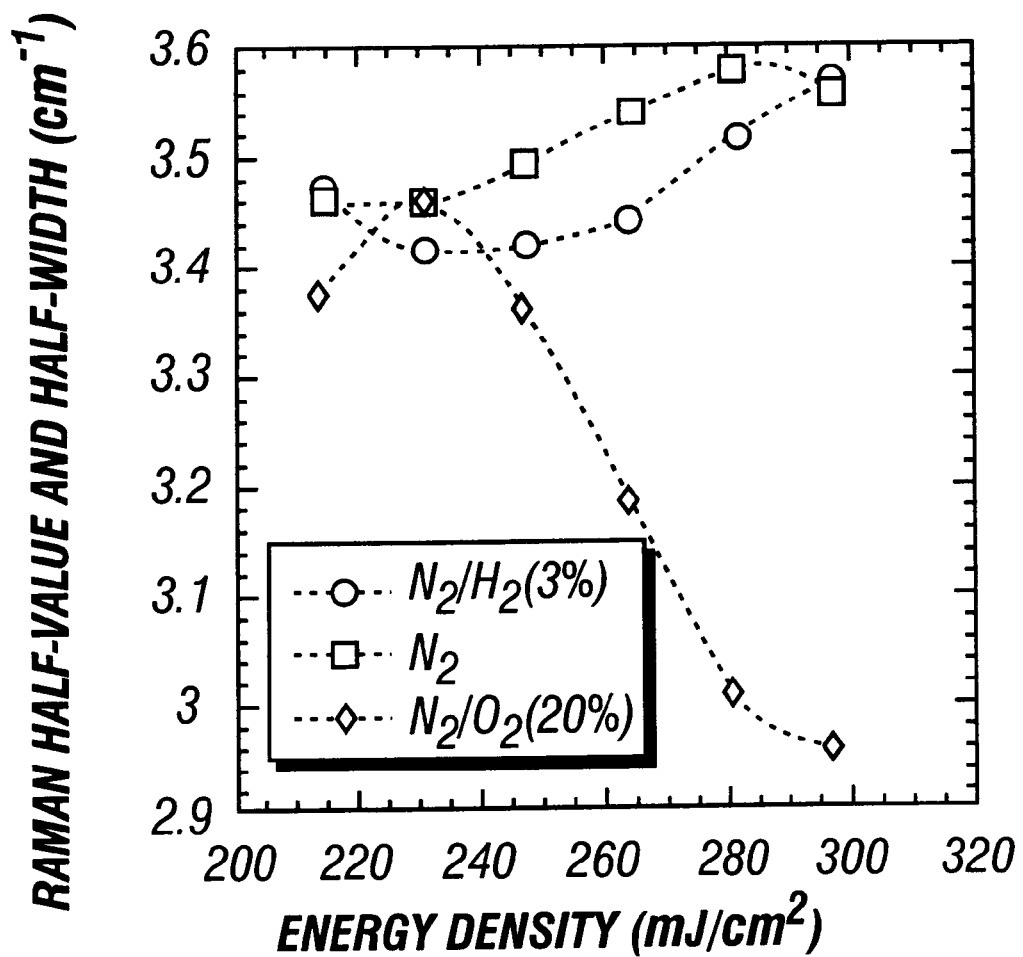
FIG. 4 is a graph showing a relation between the energy density of a laser beam and the Raman half-value and half-width of the crystalline silicon film which has been laser-annealed in the case where laser-annealing is conducted in a variety of atmospheres.

FIG. 4 shows a relation between the energy density of a laser beam and the Raman half-value and half-width of the crystalline silicon film which has been laser-annealed in the case where laser-annealing is conducted in a variety of atmospheres. The Raman half-value and half-width means ½ of the Raman half-value width. In FIG. 4, the crystalline silicon film which has been manufactured in $N_2/O_2$ (20%) atmosphere which is used in the above process as an atmosphere containing oxygen therein is indicated as ◇, the crystalline silicon film which has been manufactured in $N_2/H_2$ (3%) atmosphere is indicated by ○, and the crystalline silicon film which has been manufactured in $N_2$ 100% atmosphere is indicated by.

It is understandable from FIG. 4 that the crystalline silicon film which has been laser-annealed in the atmosphere containing oxygen therein in accordance with the present invention is more lowered in the Raman half-value and half-width as the energy density is increased, that is, the crystallinity is improved.

Naturally, even though laser-annealing is conducted in an atmosphere containing oxygen therein, if the energy density of the laser beam is too increased, the entire film is largely roughened while the crystallinity is improved. This makes it difficult to use the film as a device such as a thin-film transistor. In this example, the energy density of the laser beam is preferably set to 270 mJ/cm$^2$ or less.

On the other hand, in a range of the energy density shown in FIG. 4, the crystallinity is low in any cases of other atmospheres.

The laser-annealing in the above atmosphere containing oxygen therein may be conducted not in the atmospheric pressure, but in a pressure lower than the atmospheric pressure, in particular, under the reduced pressure of 0.01 to 700 Torr. With the conduction of laser annealing under the above reduced pressure, the roughness of the surface or the entirety of the annealed crystalline silicon film can be reduced.

Thereafter, a thin-film transistor(TFT) is fabricated using the crystalline silicon film 203 thus fabricated. First, the crystalline silicon film 203 is etched to form an island like region 205.

Figure 2C:
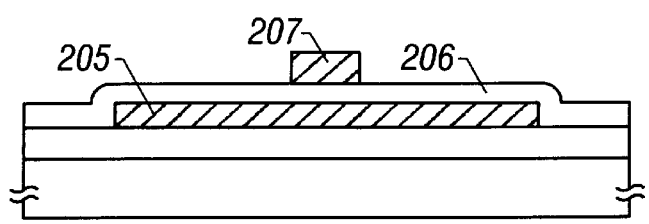

Then, a silicon oxide film that forms a gate insulating film 206 is formed with a thickness of 1200 Å through the plasma CVD technique. TEOS and oxygen are used as raw gas. The temperature of the substrate when forming a film is set to 250 to 380° C., for example, 300° C. (FIG. 2C)

Subsequently, a gate electrode is fabricated. An aluminum film 300 to 8000 Å, for example, 6000 Å in thickness is deposited through the sputtering technique. Silicon of 0.1 to 2% may be contained in the aluminum film. The above film is etched to fabricate a gate electrode 207.

Then, impurities are added to the silicon film 203. In the case of fabricating an n-channel TFT, phosphorus ions are implanted into the island region 205 through the ion doping technique with the gate electrode as a mask. The doping gas as used is phosphine ($PH_3$). The accelerating voltage is set to 10 to 90 kV, for example, 80 kV, and the dose amount is set to $1\times10^{14}$ to $5\times10^{15}$ atoms/cm$^2$, for example, $1\times10^{15}$ atoms/cm$^2$. The temperature of the substrate is set to the room temperature. As a result, a channel formation region 210 is formed, and a source 208 and a drain 209 are formed as the n-type impurity regions.

Figure 2D:
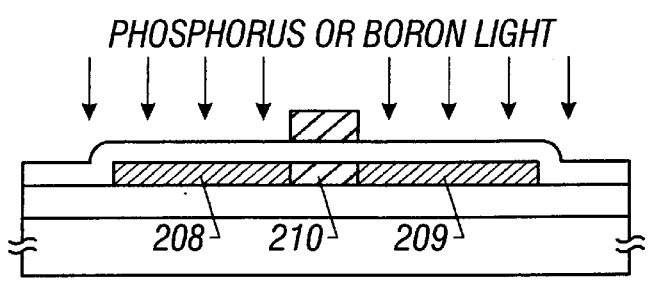

Also, in the case of fabricating the p-channel type TFT, boron ions are implanted into the island region 205 through the ion doping technique with the gate electrode as a mask. The doping gas as used is, for example, diborane ($B_2H_6$) which has been diluted to 5%. The accelerating voltage is set to 60 to 90 kV, for example, 65 kV, and the dose amount is set to $2\times10^{15}$ to $5\times10^{15}$ atoms/cm$^2$, for example, $3\times10^{15}$ atoms/cm$^2$. The temperature of the substrate is set to the room temperature. As a result, a channel formation region 210 is formed, and a source 208 and a drain 209 are formed as the p-type impurity regions (FIG. 2D).

Figure 2E:
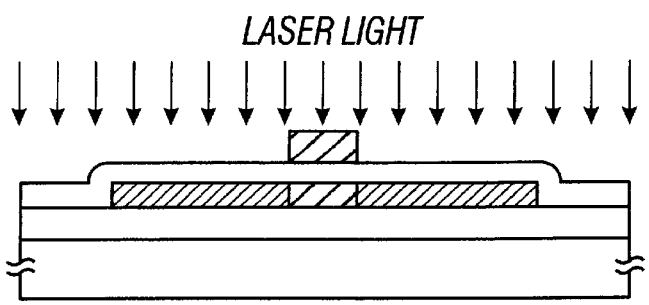

Subsequently, in order to activate the impurities doped, laser-annealing is conducted by the linear laser beam, again using the laser annealing unit shown in FIG. 3. The atmosphere within the laser irradiation chamber 101 is set to air (atmospheric pressure). The energy density of a laser beam on a surface to be irradiated is set to a range of 100 to 350 mJ/cm$^2$, for example, 160 mJ/cm$^2$. The linear laser beam is scanned. When an attention is paid to one point of an object to be irradiated, laser beams of 20 to 40 shots are irradiated thereon. The temperature of the substrate is set to 200° C. Thereafter, thermal annealing is conducted at 450° C. for 2 hours in a nitrogen atmosphere (FIG. 2E).

Subsequently, a silicon oxide film 6000 Å in thickness is formed through the plasma CVD technique to form an interlayer insulating film 211. Then, contact holes are defined in the interlayer insulating film 211 by etching. In addition, a multi-layer film made of metallic material, for example, titanium and aluminum is formed and etched to form a source electrode/wiring 212 and a drain electrode/wiring 213 through the contact holes.

Finally, thermal annealing is conducted at 200 to 350° C. in a hydrogen atmosphere under one atmospheric pressure.

Figure 2F:
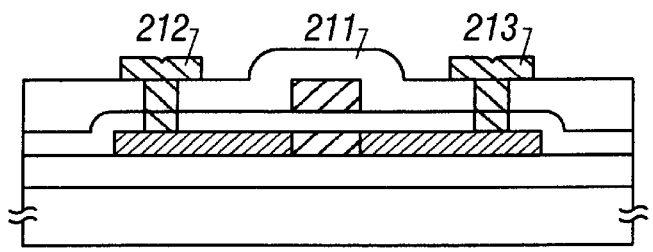

In the above manner, a plurality of n- or p-channel crystalline TFTs are formed. Those TFTs are excellent in movability such that the n-channel TFT is 70 to 120 cm$^2$/Vs and the p-channel TFT is 60 to 90 cm$^2$/Vs in mobility (FIG. 2F).

(Second Embodiment)

Figure 5:
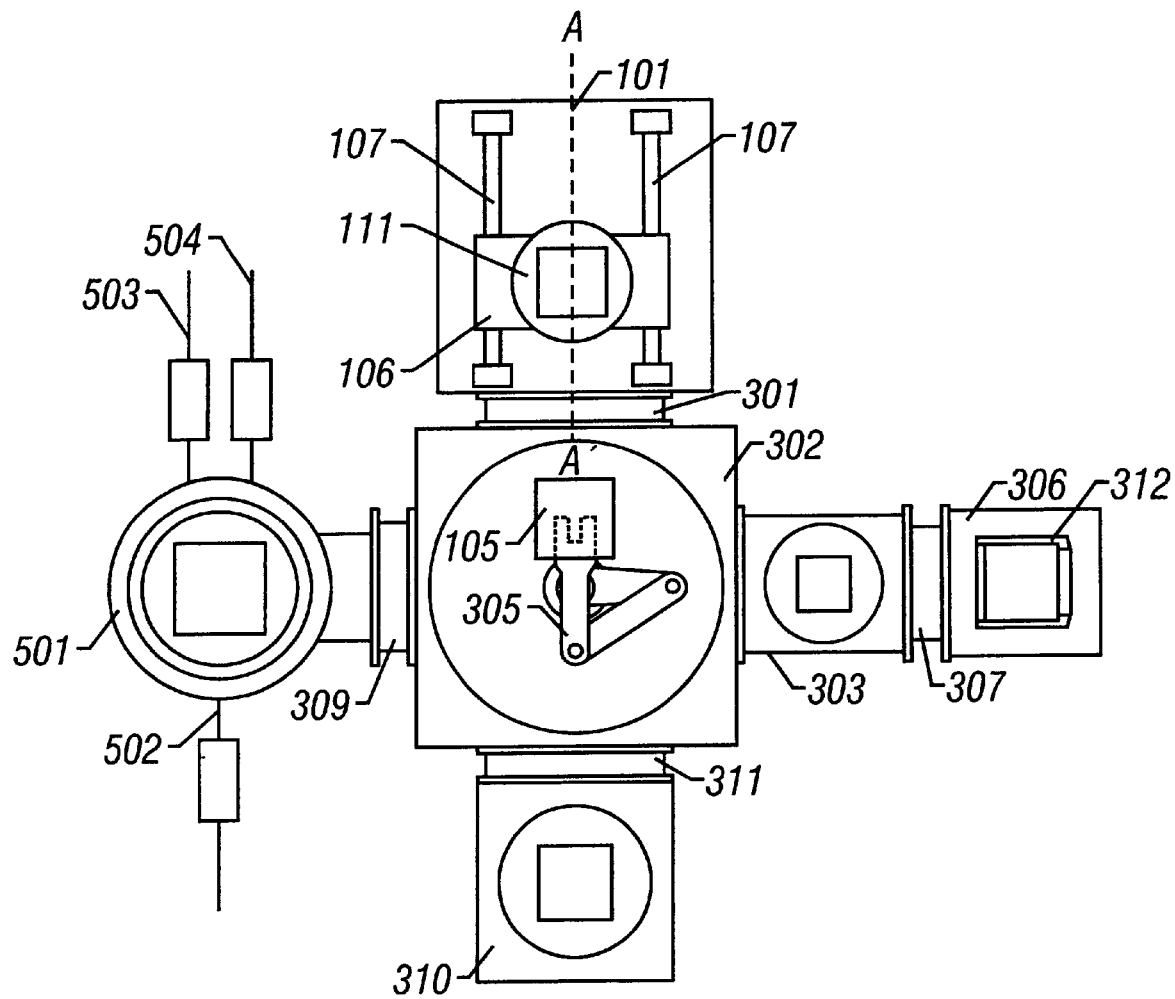
FIG. 5 is an upper view showing a laser annealing unit in accordance with the embodiment of the present invention.

A second embodiment shows an example in which after a silicon oxide film has been formed on the upper surface of a non-monocrystal silicon film in an oxygen atmosphere, laser-annealing is conducted on the film in a nitrogen atmosphere. In the second embodiment, a laser annealing unit shown in FIG. 5 is employed. A cross-sectional view taken along a line A–A' of the laser irradiation chamber 101 in FIG. 5 corresponds to FIG. 1.

As in the first embodiment, after a substrate 105 to be processed having a substrate 201 shown in FIG. 2 on which an under film 202 and a crystalline silicon film 203 which has been crystallized by thermal annealing are formed is cleaned by an HF aqueous solution or a mixture solution of HF and $H_2O_2$ so that a natural oxide film is removed from the film 203, it is received in a cassette 312, and the cassette 312 is disposed in a load/unload chamber 306.

The substrate 105 to be processed which is transferred from the load/unload chamber 306 is transferred to a preliminary heating chamber 501 after it has been subjected to alignment.

As shown in FIG. 5, the preliminary heating chamber 501 includes a vapor air-exhaust pump 502 for reducing a pressure in a space where a substrate is mounted, and gas supply pipes 503, 504 which are capable of supplying oxygen or other gases to the space where the substrate is mounted.

After vacuum is produced in the space where the substrate is mounted by the vacuum gas-exhaust pump 502 connected to the preliminary heating chamber 501, oxygen is supplied from a gas supply pipe 503, and nitrogen is supplied from a gas supply pipe 504, respectively, so as to provide an atmosphere of oxygen 5% and nitrogen 95% (both are 99.99999(7N) in purity) (atmospheric pressure) within the substrate holder. Then, when preliminary heating is conducted at 50 to 300° C., for example, 200° C., the silicon oxide film 204 is simultaneously formed with 20 to 40 Å, for example, 30 Å.

After vacuum is produced within the laser irradiation chamber 101 shown in FIG. 1 by the vacuum air-exhaust pump 108, nitrogen is supplied from a gas supply pipe 110, to provide an atmosphere of nitrogen 100% (99.99999(7N) in purity). In this situation, pressure is set to atmospheric pressure.

The substrate to be processed on which the silicon oxide film 204 has been formed in the preliminary heating chamber 501 is transferred to the laser irradiation chamber 101 after it has been subjected to alignment. The substrate 105 to be processed which has been transferred has been heated nearly to 200° C., and reaches a temperature proper for laser-annealing, in this example, 200° C. by heating for a very short period of time (several minutes) with the heater within the table 106 in the state where it is mounted on the stage 111.

Thereafter, laser-annealing is conducted under the same conditions as that in the first embodiment except for atmosphere. In this manner, laser-annealing is conducted on the crystalline silicon film 203 to improve the crystallinity (FIG. 2B).

Most of the silicon oxide film 204 is scattered by the plural times of irradiation of pulsed laser beams because it is extremely thin.

Thereafter, the substrate 105 to be processed is transferred to the cooling chamber 310, and after cooling, the substrate 105 is received in the cassette 312 of the load/unload chamber 306.

It is preferable that the upper surface of the crystalline silicon film 203 is reduced by the HF aqueous solution or the mixture solution of HF and $H_2O_2$ before shifting to the subsequent process, to thereby remove the silicon oxide film.

Thereafter, a thin-film transistor is formed in accordance with FIGS. 2C to 2F as in the first embodiment.

In the case of the second embodiment, the substrate 105 to be processed is transferred within the laser irradiation chamber 101 where an atmosphere is identical with or different from that of the preliminary heating chamber 501, to require no period of time for formation of the silicon oxide film, or to reduce the processing time, thereby being capable of conducting laser annealing and reducing the manufacture process.

Also, in the second embodiment, the atmosphere within the laser irradiation chamber 101 is set to a nitrogen atmosphere. However, it may be other atmospheres, for example, oxygen 20% and nitrogen 80% as in the first embodiment.

It should be noted that the laser-annealing in a nitrogen atmosphere has the effect of suppressing the occurrence of ridges (the roughness of the surface of the crystalline silicon film after being laser-annealed) in comparison with other air, an atmosphere containing oxygen therein, an atmosphere containing hydrogen therein, etc.

(Third Embodiment)

A third embodiment shows an example in which laser annealing is conducted in the air (atmospheric pressure)

particularly without controlling the atmosphere after the silicon oxide film 204 has been formed on the upper surface of the crystalline silicon film 203 in the preliminary heating chamber 501 shown in FIG. 5 as in the second embodiment.

In the case of laser-annealing in the air, laser-annealing excellent in crystallinity, quality uniformity, the use efficiency of energy can be conducted because the silicon oxide film 204 is formed, in comparison with a case where laser annealing is merely conducted in the air without forming the silicon oxide film 204.

In particular, if the atmosphere may not be controlled, no laser irradiation chamber 101 which is an atmosphere controllable vessel may be provided.

(Fourth Embodiment)

In the process of forming the crystalline silicon film 203 by thermal crystallization in the first embodiment (FIG. 2A), the upper surface of the crystalline silicon film 203 is oxidized by the cooling process (air atmosphere) after thermal crystallization, to thereby form a silicon oxide film having about several 10 Å thickness.

In the first embodiment, the silicon oxide film is removed by cleaning before the laser annealing process. However, in the fourth embodiment, laser annealing is conducted on the film by the laser annealing unit shown in FIG. 3 as it is without removing the silicon oxide film.

As in the second embodiment, in the case where laser-annealing is conducted on the crystalline silicon film 203 in a nitrogen atmosphere, crystallinity, quality uniformity, the use efficiency of laser energy can be remarkably improved in comparison with a case where laser annealing is merely conducted in the nitrogen atmosphere without forming the silicon oxide film.

(Fifth Embodiment)

A fifth embodiment shows an example of a continuous processing unit used in a sixth embodiment. The continuous processing unit can implement a process of cleaning the non-monocrystal silicon film, and a laser annealing process or a heating (silicon oxide film forming) process continuously without being exposed to the air.

Figure 6:
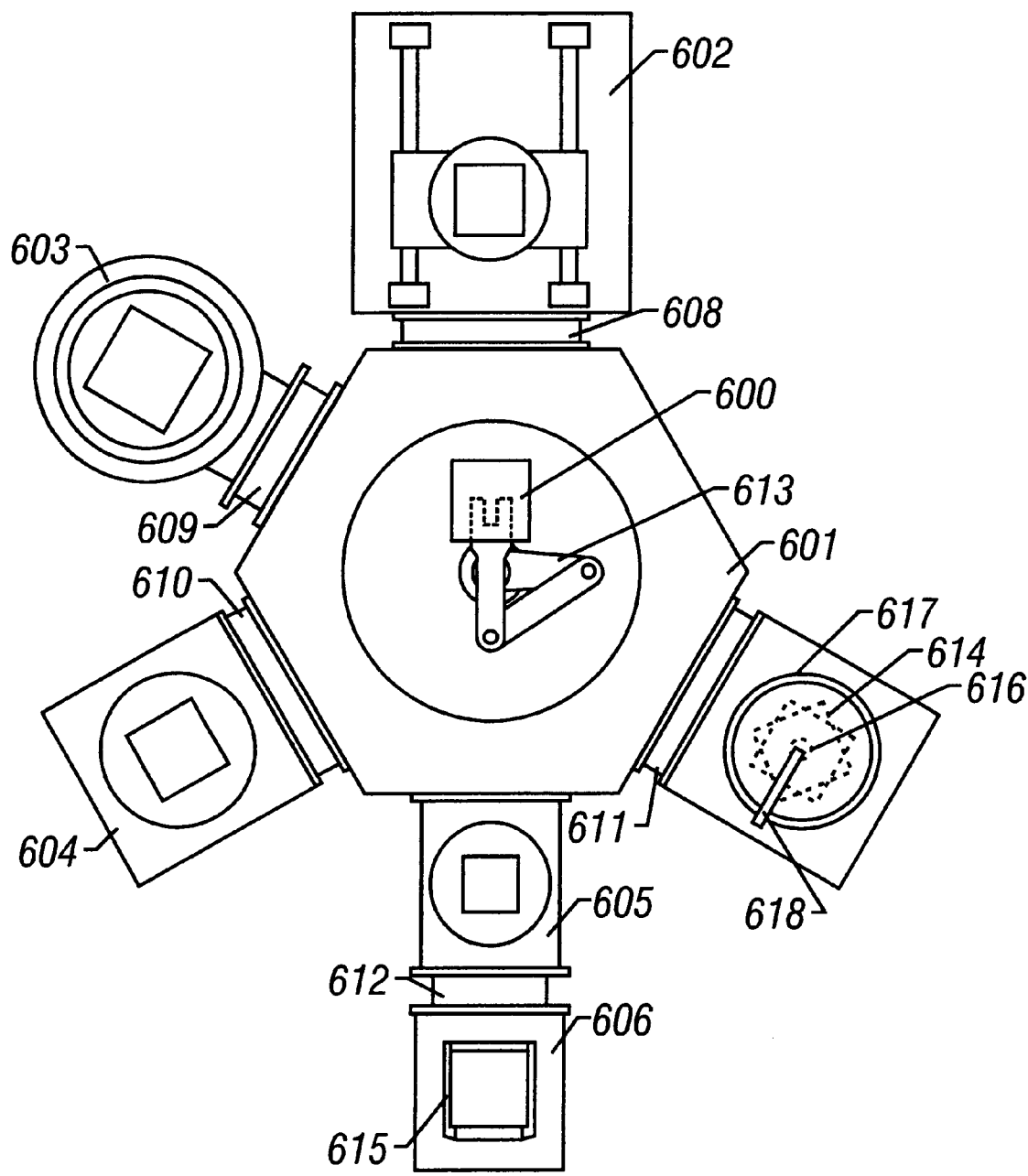
FIG. 6 is an upper view showing a continuous processing unit in accordance with the embodiment of the present invention.

FIG. 6 shows an upper view of the continuous processing unit in this embodiment. The unit shown in FIG. 6 has a structure where a substrate cleaning chamber is added to the unit shown in FIG. 3.

In FIG. 6, a substrate transfer chamber 601 is connected with a laser irradiation chamber 602, a preliminary heating chamber 603, a cooling chamber 604 and a cleaning chamber 607 through gate valves 608 to 611. Also, the substrate transfer chamber 601 is connected with a load/unload chamber 605 through an alignment chamber 606 and a gate valve 612.

Within the substrate transfer chamber 601 is disposed a robot arm 613 as substrate transfer means that transfers a substrate 600. Within the load/unload chamber 605 is disposed a cassette 615 that receives a plurality of substrates therein.

In the structure shown in FIG. 6, a description relating to the substrate transfer chamber 601, the laser irradiation chamber 602, the preliminary heating chamber 603, the cooling chamber 604, the load/unload chamber 605, and the alignment chamber 606 is omitted since they are identical in structure with the unit shown in FIG. 3 which has been described in the first embodiment.

Also, the unit shown in FIG. 6 has air-tightness kept in each chamber and between the respective chambers. Each of those chambers is provided with gas supply means and gas-exhaust means not shown so that the atmosphere and pressure in each chamber can be controlled arbitrarily. The substrate which is processed by the above unit is isolated from the external atmosphere, thereby being capable of preventing the substrate from being in contact with the air.

In FIG. 6, the cleaning chamber 607 includes a stage 616, a cap 617 and a cleaning solution outflow nozzle 618. The stage 616 fixedly sucks the rear surface of the substrate which has been transferred into the cleaning chamber 607 by vacuum, and then rotates the substrate horizontally. The cleaning solution outflow nozzle 618 discharges the cleaning solution to the center of the rotating surface of the substrate.

The preferred cleaning solution is an aqueous solution where HF 0.5 wt % and $H_2O_2$ 0.5 wt %, etc., are mixed. Instead, an aqueous solution of HF may be used. The cleaning solution allows a natural oxide film, impurities, etc., to be removed from the upper surface of the non-monocrystal silicon film.

The cap 617 is disposed so as to surround the periphery of the substrate when rotating the substrate. When transferring the substrate, the cap 617 is disposed at a position lower than a substrate fixing position on the upper surface of the stage so as to prevent the obstruction of transfer. The cap 617 receives the cleaning solution that scatters around its circumference by the rotation of the substrate, and then exhausts it downward.

A cleaning process by the unit shown in FIG. 6 will be described. After the substrate 614 is transferred into the cleaning chamber and then fixed onto the upper surface of the stage 616 by vapor-suction, the substrate rotates at a predetermined r.p.m. In this situation, the cleaning solution is discharged from the cleaning solution outflow nozzle 618 to the center of the substrate rotating surface.

The discharged cleaning solution spreads from the center of the substrate outwardly concentrically circularly due to a centrifugal force, and after the cleaning solution reaches the periphery of the substrate, it is scattered to the cap 617 and then exhausted.

After the above state is maintained for several 10 seconds to several minutes, the outflow of the cleaning solution is stopped, and r.p.m. of the substrate is increased to dry the cleaning solution.

In the above manner, the cleaning process is completed. Thereafter, the substrate 604 is moved to another chamber such as the preliminary heating chamber or the laser irradiation chamber by the transfer means 613.

With the unit shown in FIG. 6, the substrate cleaning process, that is, the process of removing the natural oxide film, the impurities, dusts or the like on the upper surface of the non-monocrystal silicon film, the laser annealing process which is conducted on the non-monocrystal silicon film in an oxygen atmosphere or the heating process (oxide film forming process) in the oxygen atmosphere can be conducted continuously without being exposed to the air.

As a result, the thin silicon oxide film formed on the upper surface of the non-monocrystal film is made high in quality without any impurities, thereby enabling excellent crystallization due to laser annealing.

Furthermore, with the unit shown in FIG. 6, cleaning the upper surface of the crystalline silicon film which has been subjected to the laser-annealing process can be conducted continuously. As a result, the crystalline silicon film having a clean surface can be provided for a process subsequent to the laser-annealing process for a shorter period of time, thus contributing to a reduction in a required manufacture time.

It should be noted that in this embodiment, the substrate cleaning is of the system in which the substrate is rotated using the cleaning solution. This system can prevent blooming or contamination of the glass substrate due to the cleaning solution because there is very little possibility of sticking the cleaning solution on the rear surface side of the substrate. Further, because the cleaning solution can be dried by only the rotation of the substrate, the entire cleaning process can be shortened in time. Also, because an equipment is compact and simple, the use of the equipment for the multi-chamber type continuous processing unit shown in FIG. 6 is effective because the location area of the device is reduced, and the design is facilitated.

However, the substrate cleaning system of this embodiment is not limited to this. For example, it may be of a structure in which the cleaning solution is discharged on the upper surface of the substrate without rotating the substrate.

Also, the non-monocrystal silicon film may be exposed to the reducing gas atmosphere.

(Sixth Embodiment)

A sixth embodiment shows an example in which a substrate cleaning process and a laser-annealing are continuously conducted without being exposed to the air, using a unit shown in FIG. 6.

A process of manufacturing a thin-film transistor in accordance with the sixth embodiment will be described with reference to FIG. 2. First, as in the first embodiment, a silicon oxide film 202 which is 2000 Å in thickness is formed as an under layer on a substrate 201 which is made of Corning 1737 having 127 mm$^2$ in area, and a amorphous silicon film which is 500 Å in thickness is formed on the silicon oxide film 202, which process is continuously conducted through the plasma CVD technique.

Subsequently, after a nickel acetate aqueous solution as in the first embodiment is coated on the amorphous silicon film, thermal annealing is conducted on the film at 600° C. for 4 hours, to thereby form a crystalline silicon film 203 (FIG. 2A).

Then, the cleaning of the crystalline silicon film and the laser annealing process in the oxygen atmosphere are continuously conducted by the continuous processing unit shown in FIG. 6.

Each chamber of the continuous processing unit shown in FIG. 6 is isolated from the air, and the atmosphere is made up of a clean gas which is cleaned so that impurities, etc., are removed therefrom. For example, it is preferable to use an inactive gas such as nitrogen, argon or helium, or oxygen mixed with each of those inactive gases, and so on. Also, the cleaned air may be used instead.

First, a substrate to be processed on which a crystalline silicon film 203 is formed is received in a cassette 615, and the cassette 615 is disposed in a load/unload chamber 606.

The substrate to be processed which is transferred from the load/unload chamber 606, after being subjected to alignment in an alignment chamber 605, is transferred to the cleaning chamber 607 where the natural oxide film and impurities are removed from the upper surface of the crystalline silicon film 203.

In the cleaning chamber 607, the substrate 614 is fixed to the stage 616, and cleaning is conducted on the substrate 614 using a cleaning solution while rotating.

The cleaning solution is discharged from a nozzle 618 to the center of the substrate rotating surface. The discharged cleaning solution moves from the center of the substrate outwardly concentrically circularly due to a centrifugal force of the substrate rotation. Thereafter, the cleaning solution scatters around the periphery of the substrate, and then exhausted after hitting on the cap 617. The cleaning solution in this example is an aqueous solution where HF 0.5 wt % and H$_2$O$_2$ 0.5 wt %, etc., are mixed. Instead, an aqueous solution of HF may be used.

The substrate is rotated at 100 to 1000 rpm, for example, 300 rpm for 10 seconds to 5 minutes, in this example, 1 minute, while receiving the cleaning solution. Thereafter, the outflow of the cleaning solution is stopped, and the substrate is rotated for about 30 seconds with an increase in rpm of the substrate for drying the upper surface of the substrate. The rpm of the substrate during drying is set to 2500 to 4000 rpm, in this example, 3000 rpm.

Thereafter, the rotation of the substrate is stopped, and the substrate is transferred from the cleaning chamber 607 by the substrate transfer means 613.

In the above manner, the upper surface of the crystalline silicon film 203 on the substrate is cleaned so that the natural oxide film and impurities are removed.

Subsequently, laser-annealing is conducted on the crystalline silicon film 203. The substrate exhausted from the cleaning chamber 607 is transferred to the laser irradiation chamber 602 directly or after being heated in the preliminary heating chamber 603.

As a result, the crystalline silicon film which has been cleaned is transferred to the laser irradiation chamber 602 continuous to the cleaning chamber 607 without being in contact with the air.

After heating up to a predetermined temperature using the preliminary heating chamber 603, the substrate is transferred to the laser irradiation chamber, thereby being capable of reducing a substrate heating time within the laser irradiation chamber.

Then, laser annealing is conducted in the oxygen atmosphere. The laser irradiation chamber 602 is in an atmosphere of oxygen 20% and nitrogen 80%. Then, laser annealing is conducted on the crystalline silicon film 203 in the oxygen atmosphere under the same conditions as those in the first embodiment, thereby improving the crystallinity (FIG. 2B).

In this embodiment, because the continuous processing unit shown in FIG. 6 is used, the substrate to be processed is not in contact with the air from the preceding cleaners process to the laser annealing process at all, but in contact with only the clean atmosphere without any impurities. For that reason, the natural oxide film formed in the air and the impurities in the air are considerably removed in the thin silicon oxide film 204 formed on the upper surface of the crystalline silicon film 203 and in the vicinity thereof during the laser-annealing process. As a result, the silicon oxide film 204 is formed into a very pure silicon oxide film. Thus, laser-annealing can be more effectively conducted in comparison with the first embodiment.

In other words, the thickness and the quality of the silicon oxide film 204 to be formed become more uniform on the upper surface of the crystalline silicon film 203 in comparison with the first embodiment, with the result that the uniformity of the film crystallized by laser-annealing on the substrate surface is improved.

Furthermore, the invasion by impurities into the crystalline silicon film 203 during laser-annealing is more reduced. As a result, a variety of characteristics such as the mobility or the threshold value of the thin-film transistor manufactured can be more stabilized in the substrate surface as well as between the respective lots.

After the completion of the laser-annealing process, the substrate is transferred to the cooling chamber 604 and gradually cooled as occasion demands.

Thereafter, although the substrate may be transferred to the load/unload chamber, the silicon oxide film is liable to remain on the upper surface of the crystalline silicon film 203 after the completion of the laser annealing process.

In other words, in laser-annealing in an atmosphere containing oxygen therein, even though the silicon oxide film 204 is scattered by the plural times of irradiation of laser beams, there is a case in which the upper surface of the silicon film which has been crystallized is newly oxidized by oxygen contained in the atmosphere. Further, there is a case in which not all of the silicon oxide film 204 is scattered even though it is subjected to laser irradiation.

Accordingly, it is largely effective that the substrate is again transferred to the cleaning chamber and then cleaned after the completion of the laser annealing process.

As a process, after the substrate has been discharged from the laser irradiation chamber 602 or the annealing chamber 604, it is taken in the cleaning chamber 607 where the upper surface of the crystalline silicon film 203 is cleaned so as to remove the silicon oxide film, the impurities, etc. The conditions are made identical with those in the cleaning process before the laser-annealing process.

In this manner, the laser annealing process and the cleaning process, or the annealing process and the cleaning process are conducted continuously without being exposed to the air, thereby being capable of obtaining high cleaning property on the upper surface of the crystalline silicon film for a short period of time.

Thereafter, the substrate for which the cleaning process has been completed is transferred from the cleaning chamber 607 to the load/unload chamber 606 by the substrate transfer means 613, and then received in the cassette 615.

Then, through the processes identical with those in the first embodiment, a thin-film transistor is completed (FIGS. 2C to 2F).

The thin-film transistor thus fabricated is improved in a variety of characteristics and has stabilized characteristics in the substrate surface and between the respective lots.

(Seventh Embodiment)

A seventh embodiment shows an example in which, after the silicon oxide film has been formed on the upper surface of the non-monocrystal silicon film in the oxygen atmosphere using the continuous processing unit shown in FIG. 6, it is laser-annealed in the nitrogen atmosphere.

As in the sixth embodiment, a thin-film transistor is fabricated in accordance with FIG. 2. A silicon oxide film 202 as an under film and an amorphous silicon film a continuously formed on the substrate 201. After a nickel acetate aqueous solution is coated on the amorphous silicon film, thermal annealing is conducted on the film at 600° C. for 4 hours, to thereby form a crystalline silicon film 203 (FIG. 2A).

Then, the upper surface of the crystalline silicon film 203 is cleaned in the cleaning chamber 607 as in the sixth embodiment. As a result, the natural oxide film and the impurities are removed from the upper surface of the crystalline silicon film 203.

Subsequently, the substrate is transferred to the preliminary heating chamber 603. The preliminary heating chamber 603 is in the atmosphere of oxygen 5% and nitrogen 95% (both are 99.99999 (7N) in purity) (atmospheric pressure). Then, when preliminary heating is conducted at 50 to 300° C., for example, 200° C., the thin silicon oxide film 204 is simultaneously formed with 20 to 40 Å, for example, 30 Å on the upper surface of the crystalline silicon film 203.

The silicon oxide film 204 thus formed becomes a very pure film mixed with few impurities because the upper surface of the crystalline silicon film 203 is cleaned by the preceding cleaning process and also is not exposed to the air.

After the completion of the preliminary heating, the substrate to be processed is moved into the laser irradiation chamber 602 from the preliminary heating chamber 603 without being exposed to the air. In this example, the laser irradiation chamber 602 is in a nitrogen atmosphere.

Then, laser-annealing is conducted under the conditions identical with those in the sixth embodiment except for atmosphere, to thereby improve the crystallinity of the crystalline silicon film 203 (FIG. 2B).

The crystalline silicon film 203 which has been laser-annealed is improved in the uniformity of crystallization caused by laser annealing in the substrate surface in comparison with that obtained in the second embodiment. Further, a variety of characteristics such as the mobility or the threshold value of the thin-film transistor fabricated are more stabilized in the substrate surface as well as between the respective lots.

Moreover, since the atmosphere when conducting laser-annealing is set to a nitrogen atmosphere, the occurrence of ridges is suppressed in comparison with an oxygen atmosphere. As a result, in addition to an improvement in the crystallinity and the quality of the crystalline silicon film obtained by conducting the cleaning process and the laser annealing process continuously with the substrate being not exposed to the air, the ridges are suppressed, thereby being capable of making the quality of the crystalline silicon film more excellent.

Thereafter, as in the sixth embodiment, a thin-film transistor is formed in accordance with FIGS. 2C to 2F.

In the process of this embodiment, no period of time for forming the silicon oxide film 204 within the laser irradiation chamber is required as in the second embodiment. Hence, the manufacture process time can be reduced.

This embodiment can be implemented if a clean atmosphere is provided even though the atmosphere when conducting laser annealing is not a nitrogen atmosphere.

As described above, according to the present invention, the crystallinity and the uniformity can be remarkably improved, and the useful efficiency of energy can be also remarkably improved in comparison with a case where laser-annealing is conducted in the air or other atmospheres.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for manufacturing a semiconductor device comprising the steps of:
    cleaning a surface of a semiconductor film comprising silicon over a substrate; and
    applying a linear laser beam to said semiconductor film to form a crystalline semiconductor film in an atmosphere selected from the group consisting of a mixture of oxygen and an inactive gas, and a cleaned air.

2. A method according to claim 1 wherein said inactive gas is selected from the group consisting of nitrogen, helium and argon.

3. A method according to claim 1 wherein said cleaning is performed by using HF aqueous solution an aqueous solution containing HF and $H_2O_2$.

4. A method according to claim 1 wherein said linear laser beam has an energy density of 100 to 500 mJ/cm$^2$.

5. A method for manufacturing a semiconductor device comprising the steps of:
   removing a natural oxide film on a surface of a semiconductor film comprising silicon over a substrate; and
   applying a linear laser beam to said semiconductor film to form a crystalline semiconductor film in an atmosphere selected from the group consisting of a mixture of oxygen and an inactive gas, and a cleaned air.

6. A method according to claim 5 wherein said inactive gas is selected from the group consisting of nitrogen, helium and argon.

7. A method according to claim 5 wherein said cleaning is performed by using HF aqueous solution or an aqueous solution containing HF and $H_2O_2$.

8. A method according to claim 5 wherein said linear laser beam has an energy density of 100 to 500 mJ/cm$^2$.

9. A method for manufacturing a semiconductor device comprising the steps of:
   crystallizing a semiconductor film comprising silicon over a substrate;
   cleaning a surface of the crystallized semiconductor film; and
   applying a linear laser beam to the crystallized semiconductor film to improve the crystallinity thereof in an atmosphere selected from the group consisting of a mixture of oxygen and an inactive gas, and a cleaned air.

10. A method according to claim 9 wherein said inactive gas is selected from the group consisting of nitrogen, helium and argon.

11. A method according to claim 9 wherein said cleaning is performed by using HF aqueous solution or an aqueous solution containing HF and $H_2O_2$.

12. A method according to claim 9 wherein said linear laser beam has an energy density of 100 to 500 mJ/cm$^2$.

13. A method for manufacturing a semiconductor device comprising the steps of:
   crystallizing a semiconductor film comprising silicon over a substrate;
   removing a natural oxide film on a surface of the crystallized semiconductor film; and
   applying a linear laser beam to the crystallized semiconductor film to improve the crystallinity thereof in an atmosphere selected from the group consisting of a mixture of oxygen and an inactive gas, and a cleaned air.

14. A method according to claim 13 wherein said inactive gas is selected from the group consisting of nitrogen, helium and argon.

15. A method according to claim 13 wherein said cleaning is performed by using HF aqueous solution or an aqueous solution containing HF and $H_2O_2$.

16. A method according to claim 13 wherein said linear laser beam has an energy density of 100 to 500 mJ/cm$^2$.

17. A method for manufacturing a semiconductor device comprising the steps of:
   cleaning a surface of a semiconductor film comprising silicon over a substrate;
   forming an oxide film on the surface of said semiconductor film; and
   applying a linear laser beam to said semiconductor film in an atmosphere selected from the group consisting of a mixture of oxygen and an inactive gas, and a cleaned air.

18. A method according to claim 17 wherein said inactive gas is selected from the group consisting of nitrogen, helium and argon.

19. A method according to claim 17 wherein said cleaning is performed by using HF aqueous solution or an aqueous solution containing HF and $H_2O_2$.

20. A method according to claim 17 wherein said linear laser beam has an energy density of 100 to 500 mJ/cm$^2$.

21. A method for manufacturing a semiconductor device comprising the steps of:
   removing a natural oxide film on a surface of a semiconductor film formed over a substrate;
   forming an oxide film on the surface of said semiconductor film; and
   applying a linear laser beam to said semiconductor film in an atmosphere selected from the group consisting of a mixture of oxygen and an inactive gas, and a cleaned air.

22. A method according to claim 21 wherein said inactive gas is selected from the group consisting of nitrogen, helium and argon.

23. A method according to claim 21 wherein said cleaning is performed by using HF aqueous solution or an aqueous solution containing HF and $H_2O_2$.

24. A method according to claim 21 wherein said linear laser beam has an energy density of 100 to 500 mJ/cm$^2$.

25. A method for manufacturing a semiconductor device comprising the steps of:
   cleaning a surface of a semiconductor film comprising silicon over a substrate; and
   applying a linear laser beam to said semiconductor film to form a crystalline semiconductor film in an atmosphere selected from the group consisting of a mixture of oxygen and an inactive gas, and
   wherein said applying said linear laser beam is sequentially performed after said cleaning without exposing said semiconductor film to the air.

26. A method according to claim 25, wherein said inactive gas is selected from the group consisting of nitrogen, helium, and argon.

27. A method according to claim 25, wherein said cleaning is performed by using HF aqueous solution or an aqueous solution containing HF and $H_2O_2$.

28. A method for manufacturing a semiconductor device comprising the steps of:
   removing a natural oxide film on a surface of a semiconductor film comprising silicon over a substrate; and
   applying a linear laser beam to said semiconductor film to form a crystalline semiconductor film in an atmosphere selected from the group consisting of a mixture of oxygen and an inactive gas, and
   wherein said applying said linear laser beam is sequentially performed after said cleaning without exposing said semiconductor film to the air.

29. A method according to claim 28, wherein said inactive gas is selected from the group consisting of nitrogen, helium, and argon.

30. A method according to claim 28, wherein said cleaning is performed by using HF aqueous solution or an aqueous solution containing HF and $H_2O_2$.

* * * * *